(12) United States Patent
Shinma et al.

(10) Patent No.: US 9,368,424 B2
(45) Date of Patent: Jun. 14, 2016

(54) METHOD OF FABRICATING A SEMICONDUCTOR DEVICE USED IN A STACKED-TYPE SEMICONDUCTOR DEVICE

(75) Inventors: Yasuhiro Shinma, Isehara (JP); Junichi Kasai, Kanagawa (JP); Kouichi Meguro, Tokyo (JP); Masanori Onodera, Tokyo (JP); Junji Tanaka, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 1036 days.

(21) Appl. No.: 11/133,966

(22) Filed: May 20, 2005

(65) Prior Publication Data

US 2005/0263871 A1    Dec. 1, 2005

Related U.S. Application Data

(63) Continuation of application No. PCT/JP2004/006845, filed on May 20, 2004.

(51) Int. Cl.
*H01L 21/77* (2006.01)
*H01L 23/31* (2006.01)
(Continued)

(52) U.S. Cl.
CPC .......... *H01L 23/3128* (2013.01); *H01L 21/565* (2013.01); *H01L 25/105* (2013.01); *H01L 24/45* (2013.01); *H01L 24/48* (2013.01); *H01L 24/49* (2013.01); *H01L 2224/451* (2013.01); *H01L 2224/48227* (2013.01);
(Continued)

(58) Field of Classification Search
CPC . H01L 21/563; H01L 21/565; H01L 23/3128; B29C 45/00; B29C 45/1769; B29C 45/2703; B29C 2045/1651–2045/1653

USPC .................................................. 438/106–127
See application file for complete search history.

(56) References Cited

U.S. PATENT DOCUMENTS 5,293,072 A * 3/1994 Tsuji et al. ..................... 257/737
5,474,958 A * 12/1995 Djennas et al. ................. 29/827
(Continued)

FOREIGN PATENT DOCUMENTS

JP    55-175249    12/1980
JP    60-242017    12/1985
(Continued)

OTHER PUBLICATIONS

International Search Report for International Application No. PCT/JP2004/006845 dated Aug. 31, 2004; 1 page.
(Continued)

*Primary Examiner* — Laura Menz
*Assistant Examiner* — Maliheh Malek

(57) ABSTRACT

A method of fabricating a semiconductor device includes the steps of providing a heat-resistant sheet on an interposer so as to cover electrode terminals provided on the interposer, and sealing a semiconductor chip on the interposer sandwiched between molds with a sealing material. The electrode terminals are covered by the heat-resistant resin for protection, and the semiconductor chip is then sealed with resin. It is thus possible to avoid the problem in which contaminations adhere to the electrode terminals. This makes it possible to prevent the occurrence of resin burrs on the interposer and contamination of the electrode pads and to improve the production yield.

10 Claims, 11 Drawing Sheets

(51) Int. Cl.
  *H01L 21/56* (2006.01)
  *H01L 25/10* (2006.01)
  *H01L 23/29* (2006.01)
  *H01L 23/00* (2006.01)

(52) U.S. Cl.
  CPC ............... *H01L 2224/49171* (2013.01); *H01L 2225/1023* (2013.01); *H01L 2225/1058* (2013.01); *H01L 2924/00014* (2013.01); *H01L 2924/01078* (2013.01); *H01L 2924/01079* (2013.01); *H01L 2924/14* (2013.01); *H01L 2924/3025* (2013.01)

(56) References Cited

U.S. PATENT DOCUMENTS

| | | | | |
|---|---|---|---|---|
| 5,656,550 | A * | 8/1997 | Tsuji et al. | 438/123 |
| 5,693,572 | A * | 12/1997 | Bond et al. | 29/840 |
| 5,852,870 | A * | 12/1998 | Freyman et al. | 29/841 |
| 5,889,324 | A * | 3/1999 | Suzuki | 257/712 |
| 5,985,695 | A * | 11/1999 | Freyman et al. | 438/112 |
| 5,986,460 | A * | 11/1999 | Kawakami | 257/48 |
| 6,083,775 | A * | 7/2000 | Huang et al. | 438/118 |
| 6,140,153 | A * | 10/2000 | Ohsawa et al. | 438/123 |
| 6,246,015 | B1 | 6/2001 | Kim | 174/261 |
| 6,255,741 | B1 * | 7/2001 | Yoshihara et al. | 257/792 |
| 6,329,606 | B1 * | 12/2001 | Freyman et al. | 174/260 |
| 6,365,979 | B1 * | 4/2002 | Miyajima | 257/787 |
| 6,613,609 | B1 * | 9/2003 | Laviron et al. | 438/125 |
| 6,707,166 | B1 * | 3/2004 | Noguchi | 257/790 |
| 6,933,602 | B1 * | 8/2005 | Patel et al. | 257/712 |
| 6,989,296 | B2 * | 1/2006 | Huang et al. | 438/127 |
| 7,015,593 | B2 * | 3/2006 | Kazama | 257/790 |
| 7,071,028 | B2 * | 7/2006 | Koike et al. | 438/107 |
| 7,154,185 | B2 * | 12/2006 | Lee et al. | 257/778 |
| 7,824,937 | B2 * | 11/2010 | Suehiro et al. | 438/26 |
| 2001/0042913 | A1 * | 11/2001 | Fukuda et al. | 257/697 |
| 2001/0045625 | A1 * | 11/2001 | Sakamoto et al. | 257/666 |
| 2002/0017706 | A1 * | 2/2002 | Sone | 257/676 |
| 2002/0024127 | A1 * | 2/2002 | Sakuraba et al. | 257/686 |
| 2002/0041012 | A1 * | 4/2002 | Sakamoto et al. | 257/678 |
| 2002/0168797 | A1 * | 11/2002 | DiStefano et al. | 438/106 |
| 2002/0180010 | A1 * | 12/2002 | Tsubosaki et al. | 257/667 |
| 2003/0011052 | A1 * | 1/2003 | Kim | 257/673 |
| 2003/0017645 | A1 * | 1/2003 | Kabayashi et al. | 438/106 |
| 2003/0030133 | A1 * | 2/2003 | Terui et al. | 257/678 |
| 2003/0062630 | A1 * | 4/2003 | Tanabe | 257/783 |
| 2003/0100142 | A1 * | 5/2003 | Shin et al. | 438/110 |
| 2003/0166313 | A1 * | 9/2003 | Nishikawa et al. | 438/118 |
| 2003/0178709 | A1 * | 9/2003 | Andoh | 257/667 |
| 2003/0178726 | A1 * | 9/2003 | Ogawa et al. | 257/758 |
| 2003/0222344 | A1 * | 12/2003 | Hosoyamada et al. | 257/738 |
| 2004/0005733 | A1 * | 1/2004 | Fujisawa et al. | 438/110 |
| 2004/0026823 | A1 * | 2/2004 | Thummel | B29C 45/14655 264/272.14 |
| 2004/0029318 | A1 * | 2/2004 | Kazama | 438/127 |
| 2004/0070056 | A1 * | 4/2004 | Matsuzawa et al. | 257/666 |
| 2004/0090829 | A1 * | 5/2004 | Miura et al. | 365/200 |
| 2004/0104458 | A1 * | 6/2004 | Tsukada et al. | 257/669 |
| 2004/0115920 | A1 * | 6/2004 | Yamazaki et al. | 438/613 |
| 2004/0119146 | A1 * | 6/2004 | Masuya | 257/666 |
| 2004/0164385 | A1 * | 8/2004 | Kado et al. | 257/678 |
| 2004/0166609 | A1 * | 8/2004 | Murayama et al. | 438/122 |
| 2004/0212059 | A1 * | 10/2004 | Kato et al. | 257/678 |
| 2004/0218372 | A1 * | 11/2004 | Hamasaki et al. | 361/767 |
| 2004/0257779 | A1 * | 12/2004 | Itoh et al. | 361/752 |
| 2005/0051810 | A1 * | 3/2005 | Funakura et al. | 257/232 |
| 2005/0133895 | A1 * | 6/2005 | Ujiie et al. | 257/678 |
| 2005/0189627 | A1 * | 9/2005 | Ito et al. | 257/666 |
| 2005/0263871 | A1 | 12/2005 | Shinma et al. | |
| 2006/0073226 | A1 * | 4/2006 | Kimura et al. | 425/129.1 |

FOREIGN PATENT DOCUMENTS

| | | |
|---|---|---|
| JP | 6-13541 | 1/1994 |
| JP | 07-183426 | 7/1995 |
| JP | 8-236694 | 9/1996 |
| JP | 10 256288 | 9/1998 |
| JP | 11-026652 | 1/1999 |
| JP | 2001 326238 | 11/2001 |
| JP | 2002134661 | 5/2002 |
| JP | 2003-218273 | 7/2003 |

OTHER PUBLICATIONS

Written Opinion of the International Searching Authority for International Application No. PCT/JP2004/006845 dated Aug. 31, 2004; 3 pages.

* cited by examiner

US 9,368,424 B2

METHOD OF FABRICATING A SEMICONDUCTOR DEVICE USED IN A STACKED-TYPE SEMICONDUCTOR DEVICE

CROSS REFERENCE TO RELATED APPLICATIONS

This is a continuation of International Application No. PCT/JP2004/006845, filed May 20, 2004.

BACKGROUND OF THE INVENTION

1. Field of the Invention

The present invention relates to a method of fabricating a semiconductor device in which only a single surface of a substrate is sealed with resin, and a semiconductor device thus fabricated. More particularly, the present invention relates to a method of fabricating a semiconductor device used in a stacked-type semiconductor device having a plurality of packages stacked.

2. Description of the Related Art

Recently, portable electronic devices such as cellular phones and non-volatile storage media such as IC memory cards have been downsized and it has been required to reduce the number of parts used in the electronic devices and storage media and to downsize these parts.

It is thus desired to efficiently package semiconductor elements or chips, which are major components among the parts of the electronic devices. A stacked-type package in which a memory-use package and a logic-use package are stacked is known as one of the packages that meet the above desire. Documents 1 through 3 disclose methods of fabricating stacked-type packages; Patent Document 1: Japanese Patent Application Publication No. 8-236694; Patent Document 2: Japanese Patent Application Publication No. 2003-218273; and Patent Document 3: Japanese Patent Application Publication No. 6-13541.

An example of the stacked-type packages is shown in FIG. 1. The stacked-type package shown in FIG. 1 has a first semiconductor device 110 on which a second semiconductor device 120 is stacked. The first semiconductor device 110 has a semiconductor chip that is mounted on an interposer 111 and is not shown. The semiconductor chip is sealed with a sealing material 112. Solder balls 113 for making an electrical connection with another substrate are provided on the backside of the interposer 111. Similarly, the second semiconductor device 120 has a semiconductor chip that is mounted on an interposer 121 and is not shown. The semiconductor chip is sealed with a mold resin 122. Solder balls 123 are provided on the backside of the interposer 121.

FIG. 2A shows top and cross-sectional views of a first structure of the first semiconductor device 110, and FIG. 2B shows top and cross-sectional views of a second structure thereof. As shown in FIGS. 2A and 2B, electrode pads 114 for making an electrical connection with the solder balls 123 of the second semiconductor device 120 are provided on the interposer 111 of the first semiconductor device 110. When the second semiconductor device 120 is stacked on the first semiconductor device 110, the solder balls 123 of the second semiconductor device 120 are aligned with the electrode pads 114 of the first semiconductor device and are brought into contact therewith, so that the first semiconductor device 110 and the second semiconductor device 120 are electrically connected.

A description will now be given of a method of sealing the semiconductor chip of the first semiconductor device 110 with the sealing material 112. As shown in FIG. 1, the first and second semiconductor devices 110 and 120 are sealed with the sealing materials 112 and 122 in order to protect the semiconductor devices from a shock and scratch. The molding of resin is generally implemented by transfer molding. In the transfer molding, at the time of molding the sealing material 112 on the rigid interposer 111 that is typically a glass epoxy substrate, the interposer 111 is placed in molds 130 and is clamped, as shown in FIG. 3. In the molds 130, there are formed a gate 131 that is a passage of injected resin and a cavity 132 in which resin is injected. The resin is supplied to the cavity 132 via the gate 131 and is provided around the semiconductor chip.

As shown in FIG. 2A, a gold plating portion 115 that has a poor adhesiveness to the sealing material is formed at a single corner of the interposer 111 on which the gate serving as the passage of resin is provided. The gold plating portion 115 is provided on the interposer 111 in order to remove the resin on the gate after the resin is molded.

In a case where a small number of electrode pads 114 is provided on the interposer 111, the gate 116 may be positioned outside of the interposer 111 in which a large area for forming the sealing material 112 is provided on the interposer 111, as shown in the conventional second structure of the first semiconductor device 110 shown in FIG. 2B. In contrast, as shown in the conventional first structure of the first semiconductor device 110 shown in FIG. 2A, the gate is inevitably provided on the interposer 111 in a case where the area for forming the sealing material 112 is made small and the electrode pads 114 are arranged so as to surround the sealing material in order to use an increased number of electrode pads 114. Thus, the corner of the interposer 111 is not provided with the electrode pads 114 but the gold plating portion 115.

However, the above-mentioned transfer molding has a disadvantage in that fat and oil and powder dusts such as resin burrs may adhere to the interposer 111 and the electrode pads 114 may be contaminated because the interposer 111 is placed in the molds 130 without any processing and is sealed with the sealing material. This affects the bondability of the semiconductor devices and degrades the production yield.

The presence of the gold plating portion 115 shown in FIG. 2A does not allow the electrode pads 114 to be arranged in the area of the gold plating portion 115 on the interposer 111. Thus, the interposer 111 is required to have a larger size to compensate for the lost electrode pads 114. The user of the larger size prevents downsizing of the semiconductor device.

A molding process of a top gate type has been proposed to overcome the above disadvantage, in which the sealing material is provided from the upper side of the semiconductor chip. However, this process has the following disadvantages. First, it is difficult to remove a remaining gate portion and a remaining runner portion after molding. Second, it is necessary to clean up the molds each time the molds are used because an inlet for injection of resin is small. Third, the molds are complicated and are thus expensive.

SUMMARY OF THE INVENTION

The present invention has been made taking the above into consideration and has an object of providing a method of fabricating a semiconductor device and a semiconductor device capable of preventing the occurrence of resin burrs on the interposer and contamination of the electrode pads and improving the production yield.

The above object of the present invention is achieved by a method of fabricating a semiconductor device comprising the steps of: providing a heat-resistant sheet on an interposer so as to cover electrode terminals provided on the interposer; and sealing a semiconductor chip on the interposer sandwiched between molds with a sealing material.

The electrode terminals are covered by the heat-resistant sheet to protect the electrode terminals, and the semiconductor chip is sealed with the sealing material, so that the electrode terminals can be prevented from being contaminated. When the sealing material is resin, it is possible to prevent the occurrence of resin burrs on the interposer and contamination of the electrode pads and to improve the production yield. The heat-resistant sheet sandwiched between the interposer and the sealing material makes it easy to detach the sealing material from the interposer after molding. Thus, there is no need to provide gold plating for detachment of the sealing material, and the electrode terminals can be provided in the area corresponding to the gate of the interposer.

The method may be configured so that the step of providing comprises a step of attaching the heat-resistant sheet to the interposer by an adhesive. With this structure, it is thus possible to prevent displacement and detachment of the heat-resistant sheet.

The method may be configured so that the heat-resistant sheet comprises layers laminated and has flexibility on a side of the heat-resistant sheet brought into contact with the interposer. With this structure, it is possible to prevent the interposer from being damaged due to pressure developed at the time of clamping the molds. If the surface of the interposer has roughness due to metal interconnection lines or the like formed thereon, the heat-resistant sheet having the flexibility prevents the sealing material from entering into the rough surface.

The method may be configured so that the heat-resistant sheet has an opening for arranging the heat-resistant sheet on the interposer so as not to overlap with the semiconductor chip sealed with the sealing material.

The heat-resistant sheet is removed from the interposer after molding of the sealing material. By arranging the heat-resistant sheet so as not to overlap with the sealing material, the heat-resistant sheet can be removed easily.

The method may be configured so that it further comprises a step of providing ball terminals on a backside of the interposer opposite to a side thereof on which the heat-resistant sheet is provided. The ball terminals are attached to the backside of the interposer with the heat-resistant sheet remaining thereon. It is thus possible to prevent the electrode terminals on the interposer from being contaminated due to flux coating and flux cleaning with a chemical at the time of attaching the ball terminals.

The method may be configured so that the interposer and the heat-resistant sheet have guide holes that can engage a guide pin of at least one of the molds, the method further comprising a step of placing the interposer and the heat-resistant sheet in the molds in position by inserting the guide pin into the guide holes.

The guide pins are originally used to position the interposer and are further used to position the heat-resistant sheet. It is thus possible to certainly arrange the interposer and the heat-resistant sheet in the molds without breaking the positional relationship between the interposer and the heat-resistant sheet.

The method may be configured so that one of the molds has a first cross section in a passage through which the sealing material is injected into a cavity, and a second cross section at an interface between the passage and the cavity in which the semiconductor chip is accommodated, the second cross section being smaller than the first cross section.

It is thus possible to set the internal pressure in the gate in which the heat-resistant sheet is arranged higher than the internal pressure in the vicinity of a cavity inlet and thus press the heat-resistant sheet against the interposer. This prevents resin of the sealing material from entering into a space between the heat-resistant sheet and the interposer.

The method may further include a step of removing the heat-resistant sheet from the interposer.

The method may be configured so that the electrode terminals are provided on a whole surface of the interposer except an area in which the semiconductor chip is located. With this method, the electrode terminals can be arranged in the area corresponding to the gate of the interposer and the semiconductor device can be downsized.

The method may further include a step of stacking another semiconductor on said semiconductor chip sealed with the sealing material. The stacked-type semiconductor device enables efficient packaging.

The method may be configured so that the sealing material is resin. By packaging the semiconductor chip with resin, the semiconductor chip can be protected against shock and scratch.

A semiconductor device of the present invention includes: a semiconductor chip sealed with a sealing material; and an interposer supporting the semiconductor chip sealed with the sealing material, the sealing material having a shape defined by molding using a heat-resistant sheet provided on the interposer so as to cover electrodes on the interposer.

The electrode terminals are covered by the heat-resistant sheet to protect the electrode terminals, and the semiconductor chip is sealed with the sealing material, so that the electrode terminals can be prevented from being contaminated. When the sealing material is resin, it is possible to prevent the occurrence of resin burrs on the interposer and contamination of the electrode pads and to improve the production yield.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to the accompanying drawings, of embodiments of the present invention. The following description is directed to a stacked-type semiconductor device. However, the semiconductor device fabricated by the present invention is not limited to the stacked-type semiconductor device. For example, the present invention may be used as a technique for preventing contamination of a signal pattern on a semiconductor chip caused by resin molding.

First Embodiment

An embodiment of the stacked-type semiconductor device fabricated by the present invention will now be described with reference to FIG. 4. A stacked-type semiconductor device 1 shown in FIG. 4 has a two-stage structure in which a second semiconductor device 20 is stacked on a first semiconductor device 10.

Figure 4:
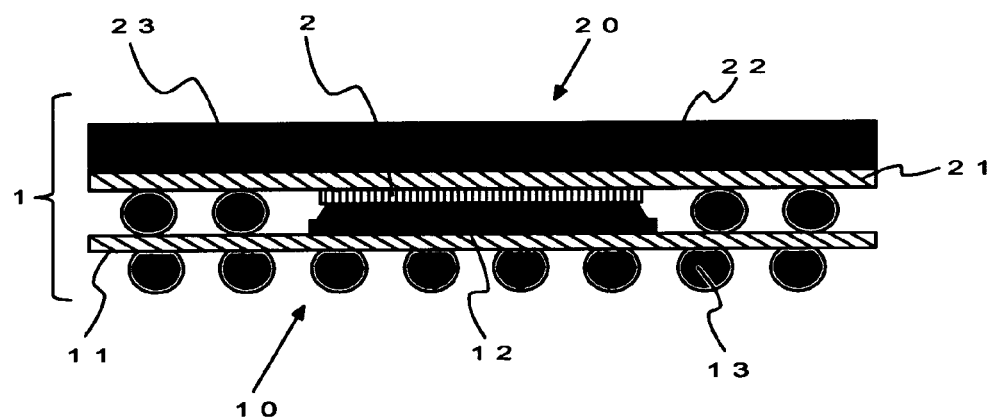
FIG. 4 is a cross-sectional view of a stacked type semiconductor device according to the present invention.

The first semiconductor device 10 shown in FIG. 4 has a semiconductor chip 14 (not shown in FIG. 4), which is mounted on a surface of the interposer 11 and is sealed with a sealing resin 12. The sealing of the semiconductor chip 14 with the sealing resin 12 prevents the semiconductor chip 14 from receiving a shock or being scratched. The sealing material 12 may be resin such as epoxy, silicone or polyimide. Solder balls 13 are provided on the backside of the interposer 11, and are used to make connections with test pins of a test probe or another substrate.

The second semiconductor device 20 shown in FIG. 4 has a not-shown semiconductor chip mounted on a surface of an interposer 21, which is totally sealed with a sealing material 22. Solder balls 23 are provided on the backside of the interposer 21, and are used to make electrical connections with the first semiconductor device 10. As shown in FIG. 4, the first semiconductor device 10 and the second semiconductor device 20 are fixed to each other by an adhesive 2.

Figure 1:
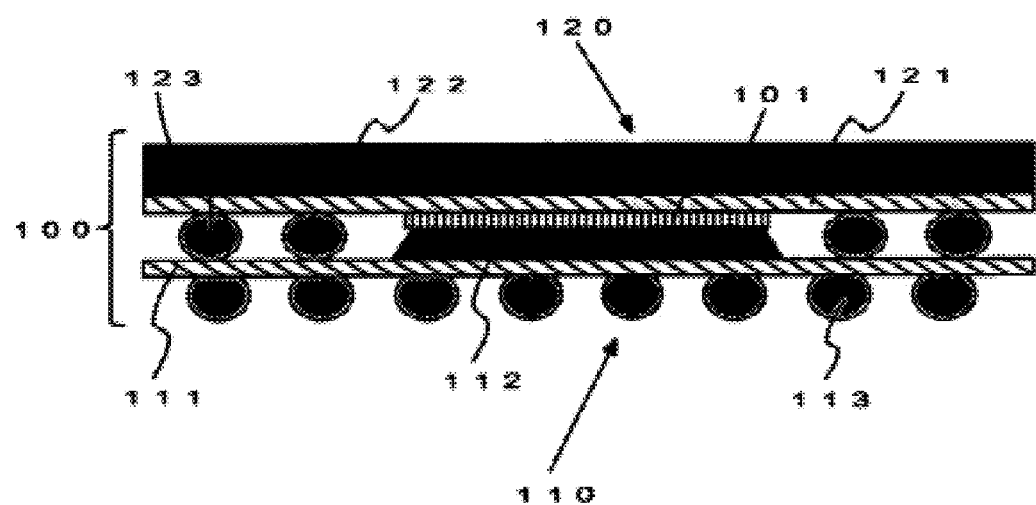
FIG. 1 is a cross-sectional view of a conventional stacked-type semiconductor device.
Figure 2:
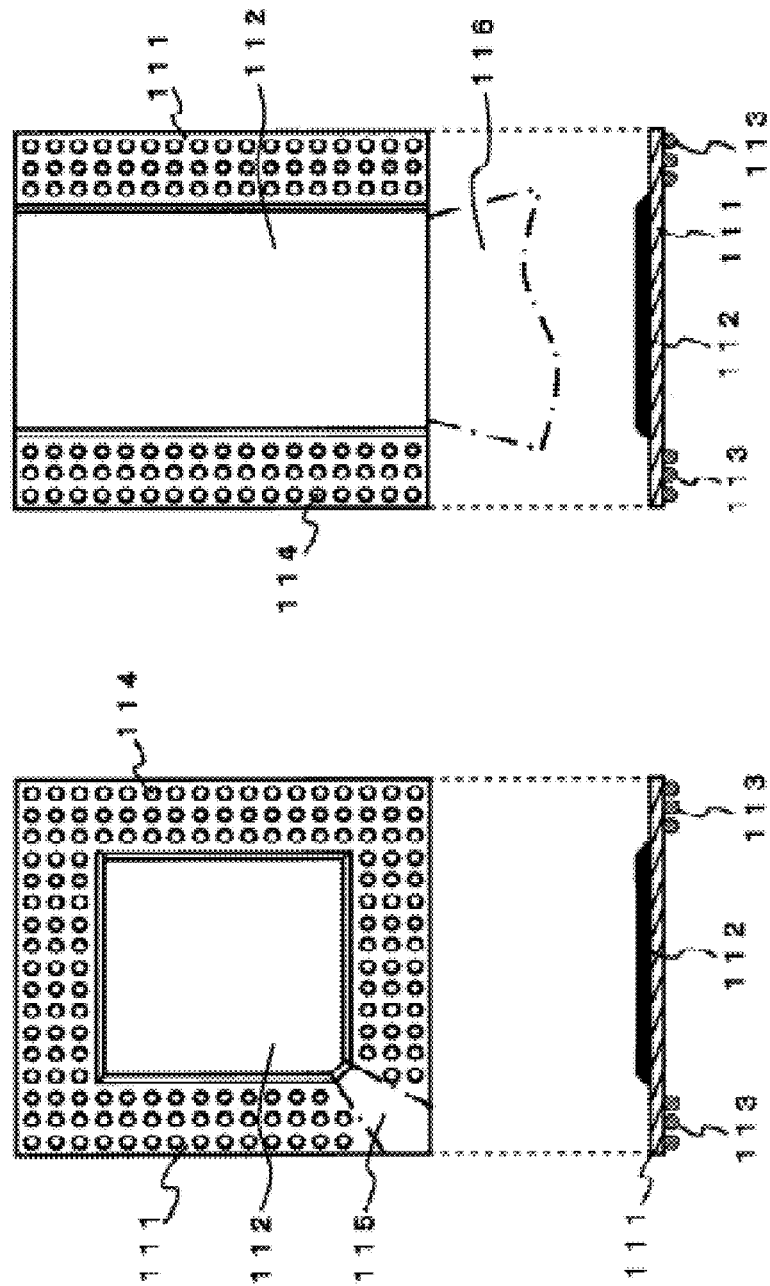
FIG. 2A shows top and cross-sectional views of a conventional first structure of a first semiconductor device.
FIG. 2B shows top and cross-sectional views of a conventional second structure of the first semiconductor device.
Figure 3:
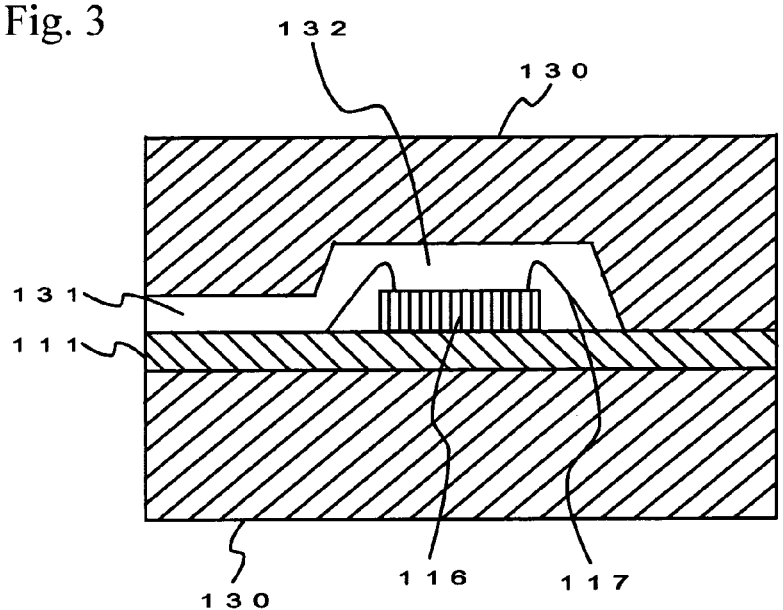
FIG. 3 shows the conventional first semiconductor device clamped by molds.
Figure 5:
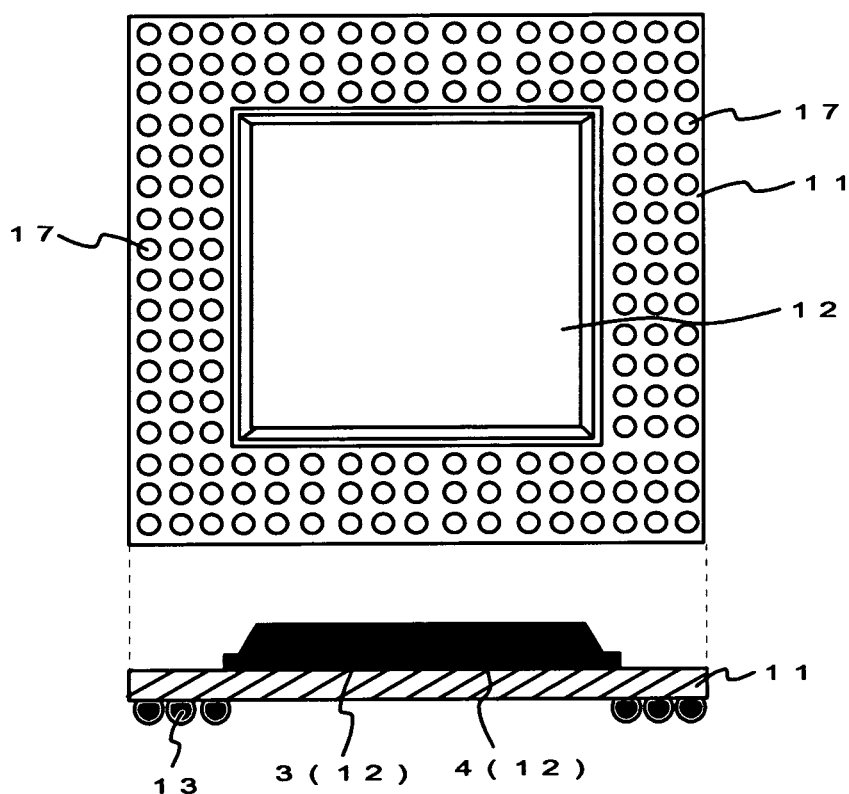
FIG. 5 shows top and cross-sectional views of a structure of the first semiconductor device.

The structure of the first semiconductor device 10 will now be described with reference to FIG. 5. FIG. 5 shows the top and side views of the first semiconductor device 10. Electrode pads or terminals 17 are provided on the interposer 11 of the first semiconductor device 10. The electrode pads 17 employed in the present embodiment are arranged in an area on the interposer 11 except for the area for the semiconductor chip. That is, there is no need to form the gold plating portion 115 as shown in FIG. 2A. Thus, the electrode pads 17 can be provided on the interposer 11 except the area for the semi-conductor chip. The electrode pads 17 and the solder balls 23 on the backside of the second semiconductor device 20 are brought into contact with each other, so that the first semiconductor device 10 and the second semiconductor device 20 can be electrically connected.

The sealing material 12 with which the semiconductor chip is sealed will now be described with reference to the side view shown in FIG. 5. The sealing material 12 is composed of a first sealing material 3 (12) provided on the interposer 11 and a second sealing material 4 (12) that is provided on the first sealing material 3 (12) and has a quadrangular pyramidal shape having a flat top portion. That is, the first sealing material 3 (12) has a size that surrounds the circumference of the second sealing material 4 (12), and serves as a flange of the second sealing material 4 (12). The above-mentioned shape of the sealing material 12 stems from the use of a heat-resistant sheet 31, which is arranged so as to cover the electrode pads 17 on the interposer 11 in the process of forming the sealing material 12 for sealing the semiconductor chip. The flange of the sealing material 12 results from an arrangement in which the heat-resistant sheet 31 is spaced apart from the area for arranging the sealing material 12 by a given distance (see FIGS. 7C and 7D). Resin of the sealing material that flows between the region for forming the sealing material and the heat-resistant sheet 31 remains on the interposer 11 and serves as the flange.

Figure 6:
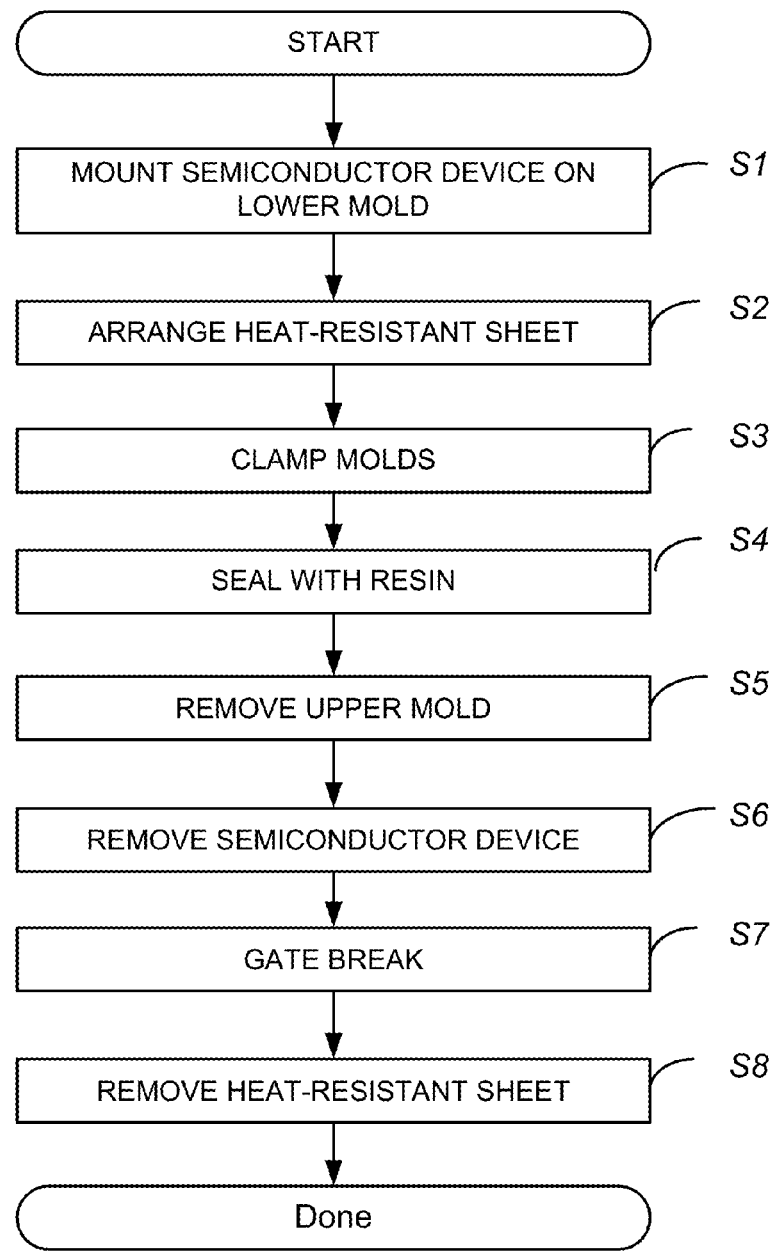
FIG. 6 is a flowchart of a process for fabricating the first semiconductor device.

A description will now be given, with reference to the flowchart of FIG. 6, of a process for sealing the semiconductor chip 14 of the first semiconductor device 10 with the sealing material 12. The following description of the process is directed to the first semiconductor device 10, but is applied to the second semiconductor device 20 to form the sealing material 22. In the following, resin is used as the sealing material used for sealing the semiconductor chip.

Figure 7A:
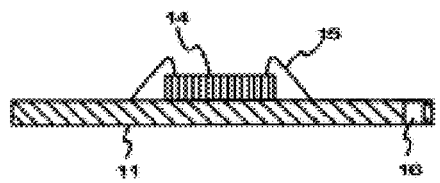
FIG. 7A shows a semiconductor device mounted on an interposer.
Figure 7B:
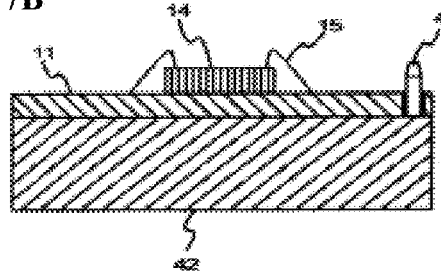
FIG. 7B shows the interposer placed on a lower mold.

First, the first semiconductor device 10 is placed on the lower mold 42 (step S1). As shown in FIG. 7A, the first semiconductor device 10 has the semiconductor chip 14 mounted on the interposer 11, and wires 15 that electrically connects the semiconductor chip 14 and the interposer 11. As shown in FIG. 7B, guide pins 43 are provided to the lower mold 42, and guide holes 16 into which the guide pins 43 are fitted are provided to the interposer 11 of the first semiconductor device 10. Since the guide pins 43 of the lower mold 42 are fitted into the guide holds 16 of the first semiconductor device 10, the first semiconductor device 10 can be positioned in the lower mold 42, as shown in FIG. 7B.

Figure 7C:
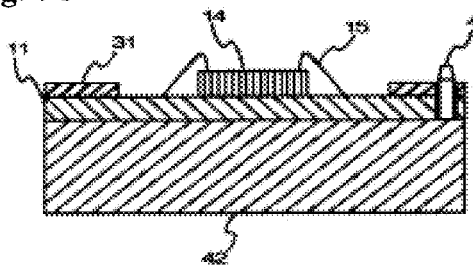
FIG. 7C shows a heat-resistant sheet disposed on the interposer.
Figure 8:
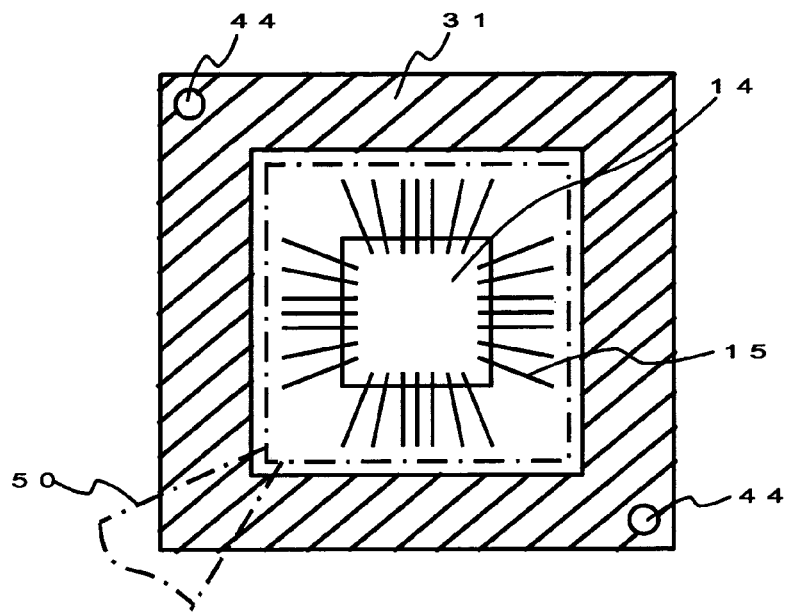
FIG. 8 shows the heat-resistant sheet provided on the interposer.

Next, the heat-resistant sheet 31 used to prevent contamination of the electrode pads 17 because of resin sealing is placed on the interposer of the first semiconductor device 10 (step S2). The heat-resistant sheet 31 has guide holes 32 into which the guide pins 43 of the lower mold 42 are inserted, so that the heat-resistant sheet 31 is placed in position on the interposer 11. FIG. 7C shows the heat-resistant sheet 31 disposed on the interposer 11, and FIG. 8 shows a top view of the first semiconductor device 10 to which the heat-resistant sheet 31 is applied. As shown in FIG. 8, the heat-resistant sheet 31 has an opening located at the center thereof and penetrated therethrough. The heat-resistant sheet 31 is disposed so as to cover the electrode pads 17 in the periphery of the cavity for forming the sealing material 12. The heat-resistant sheet 31 may be coated with an adhesive in order to prevent the heat-resistant sheet 31 from being detached from the interposer 11.

The heat-resistant sheet 31 may be PET (Polyethylene Terephthalate) resin, fluorinated resin, a metal sheet or pulp-based resin. At the time of molding the sealing material 12, the upper and lower modes 41 and 42 are kept at around 170°

C. Thus, it is preferable that the heat-resistant sheet 31 is made of a material that is little deformed or changed in size at approximately 175° C. The use of the material that has little change in size at high temperatures makes it possible for the resin of the sealing material 12 to flow between the heat-resistant sheet 31 and the interposer 11. It is not necessary to provide the separate heat-resistant sheets 31 for the semiconductor chips, although FIG. 7 shows that the heat-resistant sheet 31 is provided for only the single semiconductor chip 14 mounted on the interposer 11. In the process of packaging, multiple semiconductor chips are mounted on the interposer 11, which is then cut into the individuals after the resin sealing and given thermal treatment.

Figure 7D:
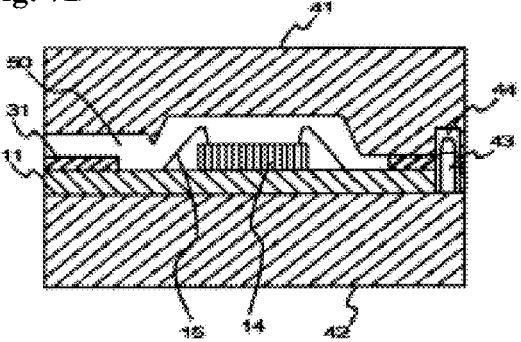
FIG. 7D shows the interposer on which a semiconductor chip is mounted, the interposer being clamped by the molds.
Figure 7E:
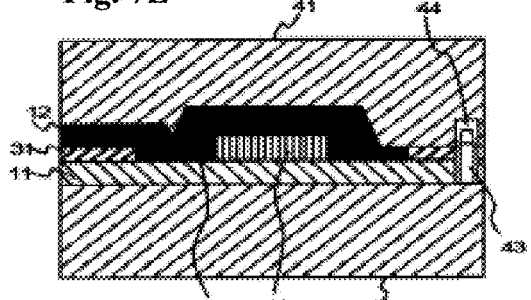
FIG. 7E shows a cavity full of resin via a gate.

Then, as shown in FIG. 7D, the upper mold 41 and the lower mold 42 are clamped together (step S3). As shown in FIG. 7E, the cavity is sealed with the resin of the sealing material 12 (step S4). When the upper mold 41 is attached to the lower mold 42, the guide pins 43 of the lower mold 42 are fitted into the guide holes 44 of the upper mold 41 as shown in FIG. 7D. Thus, the upper mold 41 is placed in position on the first semiconductor device 10.

Resin of the sealing material 12 is injected into the cavity through a gate 50 that is the path of resin. At that time, as shown in FIG. 7D, the heat-resistant sheet 31 is disposed on the lower side of the gate 50, and prevents the resin injected through the gate 50 from adhering to the electrode pads 17. The resin burrs that are likely to occur at end surfaces of the sealing material on the interposer 11 are caused to occur on the heat-resistant sheet 31, which is then removed. It is thus possible to keen the surface of the interposer 11 clean. There is no need to provide the gold plating portion in the area on the interposer 11 on which the gate 50 is provided. This makes it possible to arrange the electrode pads at all the corners of the interposer 11.

Figure 9:
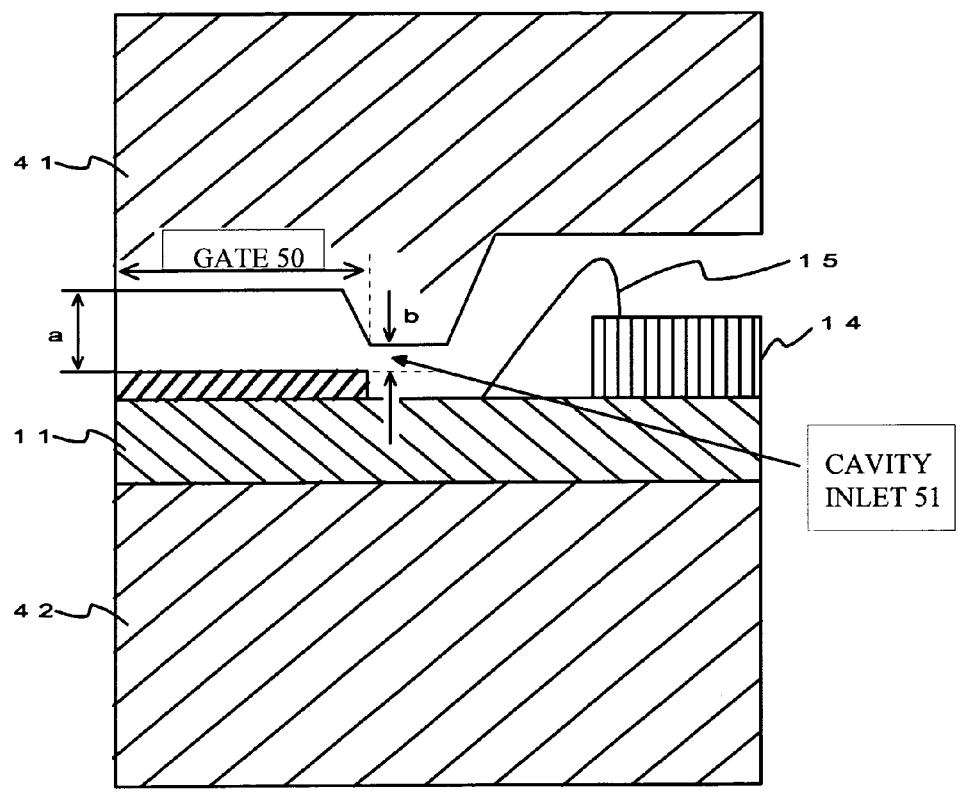
FIG. 9 is a cross-sectional view of a structure of the molds.

The molds 41 and 42 are formed so that the cross-sectional area of the passage of resin in the gate 50 is smaller than that of a cavity inlet 51. As shown in FIG. 9, the cross-sectional area "a" of the passage in the gate 50 is greater than the cross-sectional area "b" of the cavity inlet 51. This structure makes it possible to set the internal pressure in the gate 50 in which the heat-resistant sheet 31 is arranged higher than the internal pressure in the vicinity of the cavity inlet 51 and to press the heat-resistant sheet 31 against the interposer 11 by the internal pressure. It is thus possible to prevent the sealing material 12 from entering into the space between the heat-resistant sheet 31 and the interposer 11.

Figure 7F:
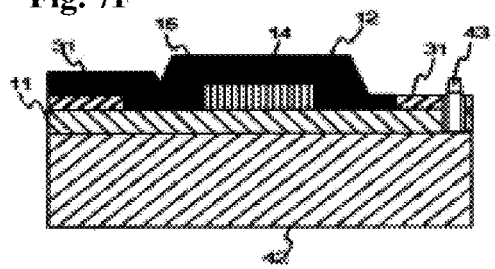
FIG. 7F shows a state in which the upper mold has been removed after the resin is molded.
Figure 7G:
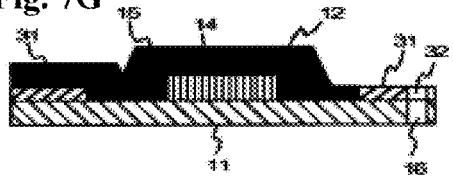
FIG. 7G shows a state in which the lower mold has been removed from the interposer.
Figure 7H:
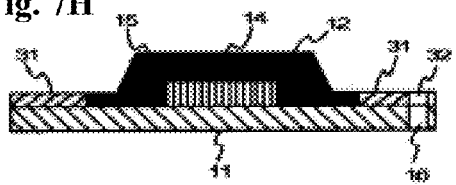
FIG. 7H shows a structure of the first semiconductor device after a gate breaking process.
Figure 7I:
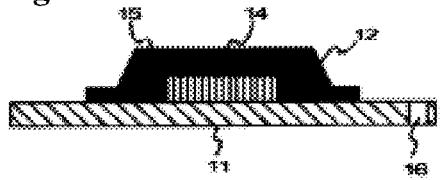
FIG. 7I shows a structure of the first semiconductor device after the heat-resistant resin 31 is removed.

After the sealing with the resin of the sealing material 12 is completed (step S4), the upper mold 41 is removed from the first semiconductor device 10 (step S5), as shown in FIG. 7F, and the first semiconductor device 10 is removed from the lower mold 42 (step S6).

After the semiconductor device 10 is removed from the lower mold 42 (step S6), the gate breaking process is carried out in which the sealing resin 12 and the resin in the gate 50 are separated from each other (step S7). Then, the heat-resistant sheet 31 is removed from the interposer 11 and the process is finished (step S8).

According to the above-mentioned fabrication process, the heat-resistant sheet 31 is arranged before the semiconductor chip 14 is sealed with the sealing material, and the heat-resistant sheet 31 is overlapped with the gate 50 for injection of resin of the sealing material 12. Thus, it is possible to the electrode pads 17 from being contaminated. The electrode pads 17 below the gate 50 can be used to make electrical connections with the upper semiconductor device to be stacked. Therefore, there is no need to use the interposer having a larger size and the production yield can be improved.

Figure 10:
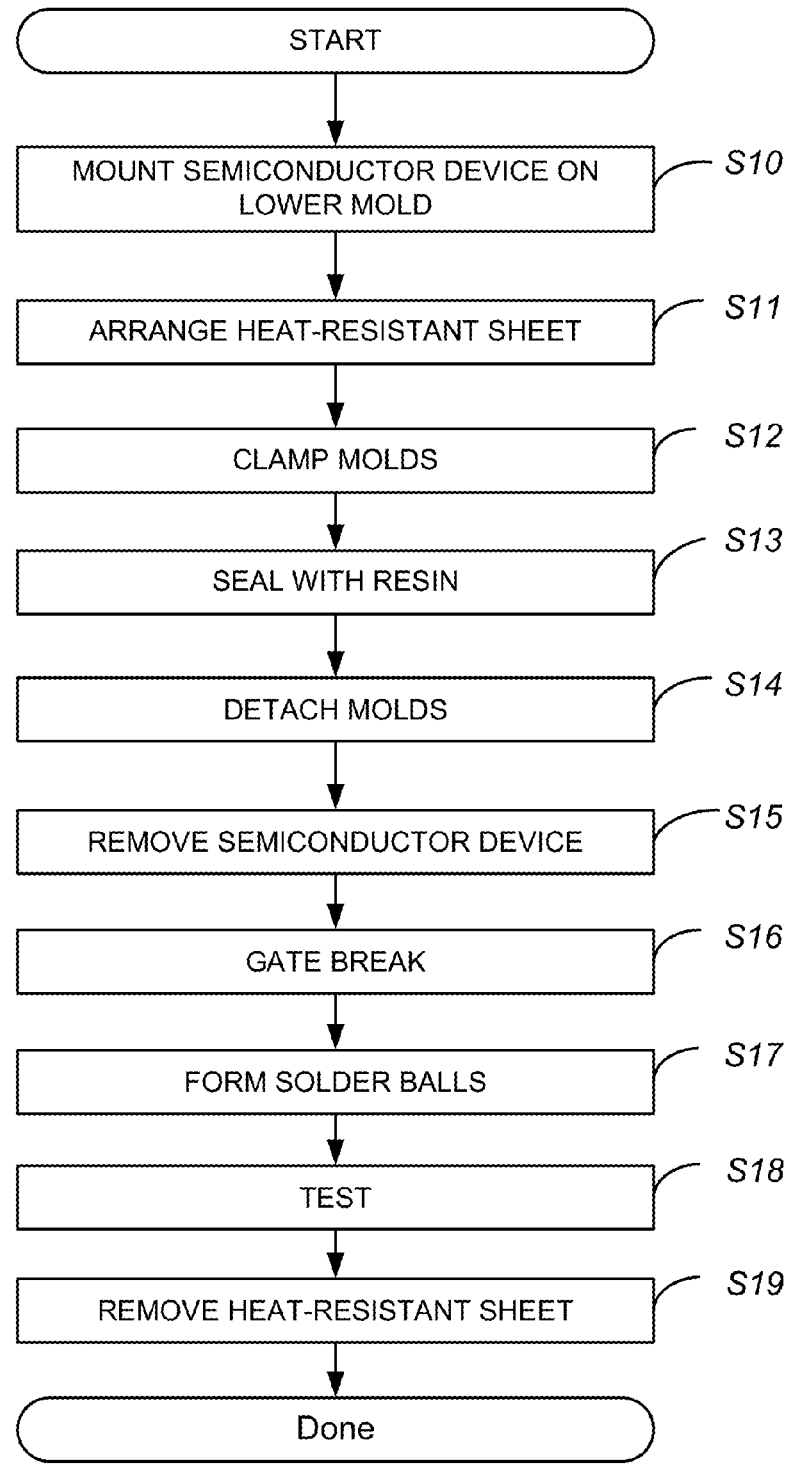
FIG. 10 is a flowchart of another process for fabricating the first semiconductor device.

In the aforementioned process, the heat-resistant sheet 31 is removed after the gate breaking process. Alternatively, the heat-resistant sheet 31 may remain on the interposer 11 for use in a subsequent process. This alternative process will now be described with reference to a flowchart of FIG. 10.

Figure 11A:
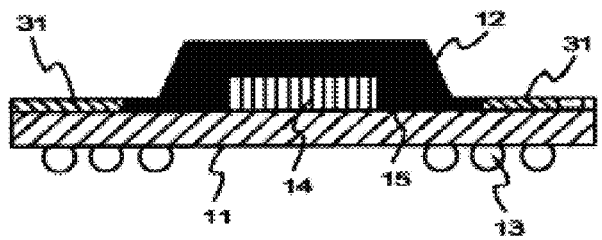
FIG. 11A shows a state in which the heat-resistant sheet remains on the interposer.
Figure 11B:
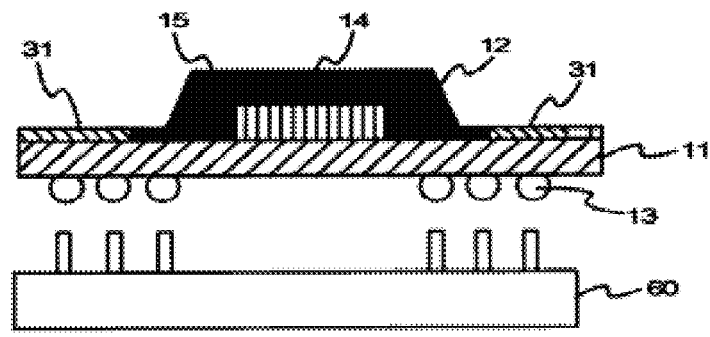
FIG. 11B shows a state in which a test with a probe is being carried out.
Figure 11C:
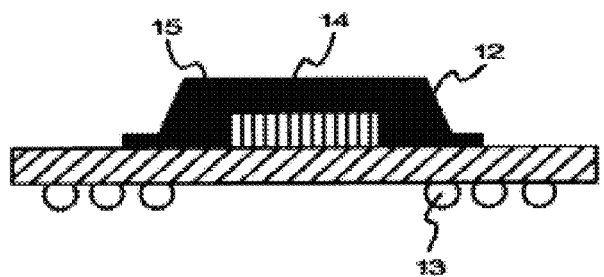
FIG. 11C shows a state in which the heat-resistant sheet has been removed after the test is finished.

The resin in the gate 50 is removed by the gate breaking process (step S16), and the solder balls 13 are attached while the heat-resistant sheet 31 remaining on the interposer (step S17). FIG. 11A shows solder balls 13 attached to the backside of the interposer 11. As shown in FIG. 11B, a probe 60 shown in FIG. 11B is connected to the solder balls 13 and a test is performed (step 18). A power and a test signal are supplied via the probe 60 for the test in which it is determined whether the first semiconductor device 10 operates normally. When the test is finished, as shown in FIG. 11C, the heat-resistant sheet is taken out of the interposer 11 and the first semiconductor device 10 is completed (step S19).

According to the present process, the solder balls 13 are mounted and the test is carried out in the state in which the heat-resistant sheet 31 used in the molding of the sealing material remains on the interposer 11. In the attachment of the solder balls 13, flux coating and flux cleaning with a chemical are performed. During this process, the electrode pads 17 are likely to be contaminated. Since the heat-resistant sheet 31 covers the electrode pads 17, the surface of the interposer can be kept clean and the yield can be improved.

Second Embodiment

Figure 12:
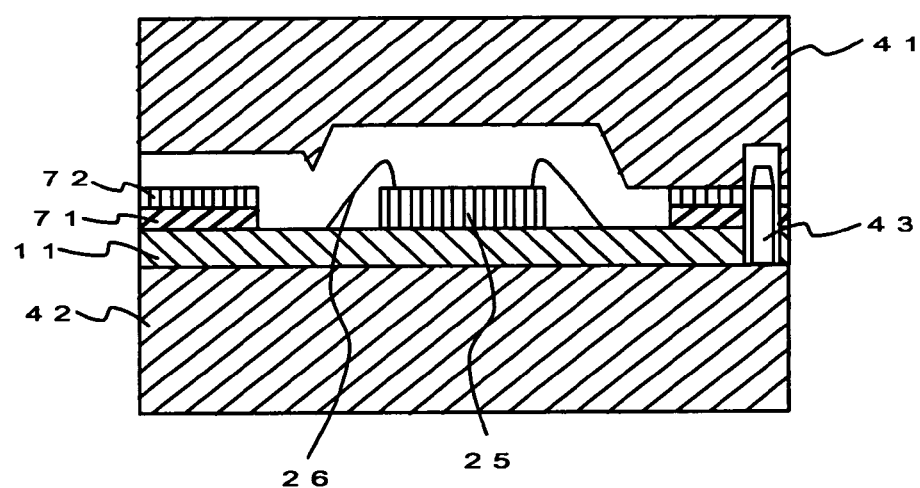
FIG. 12 shows a process for fabricating a semiconductor device according to a second embodiment and a state in which a second heat-resistant sheet is disposed on a first heat-resistant sheet.

A description will now be given, with reference to the accompanying drawings, of the second embodiment of the present invention. Referring to FIG. 12, a set of two kinds of heat-resistant sheets is disposed on the interposer 11, and is sandwiched between the molds 41 and 42 for the sealing with resin. A first heat-resistant sheet 71 arranged on the interposer 11 is a flexible sheet, which may be made of paper or a chemical sheet. A second heat-resistant sheet 72, which is stacked on the first heat-resistant sheet, is a rigid sheet, which may be made of a metal. The first heat-resistant sheet 71 is sandwiched between the interposer 11 and the second heat-resistant sheet 72.

The first heat-resistant sheet 71 provided on the rigid interposer 11 such as the glass epoxy substrate has flexibility (buffering). It is thus possible to prevent the interposer 11 from being damaged due to pressure at the time of clamping the molds. Further, the heat-resistant sheet 71 having flexibility is deformed so as to follow roughness on the surface of the interposer resulting from metal interconnection patterns formed thereon. It is thus possible to prevent the sealing material from entering into the rough surface.

It is preferable that the first and second heat-resistant sheets 71 and 72 are made of a material that is little deformed or changed in size at a temperature as high as approximately 175° C. like the heat-resistant sheet 31 used in the first embodiment. In FIG. 12, the heat-resistant sheet is composed of the first and second heat-resistant sheets 71 and 72. In an alternative, a single heat-resistant sheet may be used in which it is separated into two layers, and the lower layer has flexibility, the upper layer having rigidity.

The present invention is not limited to the specifically disclosed embodiments, but other embodiments and variations may be made without departing from the scope of the present invention.

What is claimed is:
1. A method comprising:
placing a semiconductor device on a lower mold, wherein the semiconductor device includes a semiconductor chip mounted on a first surface of an interposer having electrical pads surrounding the area of the semiconductor chip;

placing a heat-resistant sheet on the interposer so as to cover the electrical pads, wherein said heat-resistant sheet is made of a material that is little deformed or changed in size during a given thermal treatment;

clamping an upper mold to the lower mold, wherein the heat-resistant sheet is positioned on the interposer and the upper mold directly contacts the top of the heat-resistant sheet, and wherein the upper mold includes a cavity in which the semiconductor chip is accommodated and a gate;

injecting sealing material through the gate into the cavity of the upper mold, wherein the heat-resistant sheet is arranged so as not to overlap with the sealing material except for a portion of the heat-resistant sheet disposed between the gate of the upper mold and the interposer which prevents scaling material from adherine to the electrical pads;

applying the given thermal treatment to seal the semiconductor chip on the interposer by the sealing material;

removing the upper and lower molds from the semiconductor device including the semiconductor chip sealed to the interposer by the sealing material; and removing the heat-resistant sheet from the interposer of the semiconductor device including the semiconductor chip sealed to the interposer by the sealing material.

2. The method as claimed in claim 1, wherein placing the heat-resistant sheet includes attaching the heat-resistant sheet to the interposer by an adhesive.

3. The method as claimed in claim 1, wherein the heat-resistant sheet comprises layers laminated and has flexibility on a side of the heat-resistant sheet brought into contact with the interposer.

4. The method as claimed in claim 1, wherein the heat-resistant sheet has an opening for arranging the heat-resistant sheet on the interposer so as not to overlap with the semiconductor chip sealed with the sealing material.

5. The method as claimed in claim 1, further comprising providing ball terminals on a backside of the interposer opposite to a side thereof on which the heat-resistant sheet is placed.

6. The method as claimed in claim 1, wherein the interposer and the heat-resistant sheet have guide holes that can engage a guide pin of at least one of the molds, the method further comprising placing the interposer and the heat-resistant sheet in the molds in position by inserting the guide pin into the guide holes.

7. The method as claimed in claim 1, wherein one of the molds has a first cross section in the gate through which the sealing material is injected into the cavity, and a second cross section at an interface between the gate and the cavity in which the semiconductor chip is accommodated, the second cross section being smaller than the first cross section.

8. The method as claimed in claim 1, wherein the electrode are provided on a whole surface of the interposer except an area in which the semiconductor chip is located.

9. The method as claimed in claim 1, further comprising stacking another semiconductor on said semiconductor chip sealed with the sealing material.

10. The method as claimed in claim 1, wherein the sealing material is resin.

\* \* \* \* \*